(12) United States Patent
Khlat (10) Patent No.: US 10,361,660 B2
(45) Date of Patent: Jul. 23, 2019

(54) WIDE-BANDWIDTH ENVELOPE TRACKING CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/964,762

(22) Filed: Apr. 27, 2018

(65) Prior Publication Data

US 2019/0181804 A1 Jun. 13, 2019

Related U.S. Application Data

(60) Provisional application No. 62/597,990, filed on Dec. 13, 2017.

(51) Int. Cl.
| | |
|---|---|
| H03F 1/30 | (2006.01) |
| H03F 1/02 | (2006.01) |
| H03F 3/21 | (2006.01) |
| H03F 3/193 | (2006.01) |

(52) U.S. Cl.
CPC .......... *H03F 1/0233* (2013.01); *H03F 3/193* (2013.01); *H03F 3/21* (2013.01); *H03F 2200/102* (2013.01)

(58) Field of Classification Search
CPC ................................. H03F 1/30; H03F 1/0211
USPC .................................................. 330/127, 297
See application file for complete search history.

(56) References Cited

U.S. PATENT DOCUMENTS

| | | | |
|---|---|---|---|
| 8,942,651 B2 * | 1/2015 | Jones | H03F 1/0227 455/118 |
| 8,947,161 B2 * | 2/2015 | Khlat | H03F 1/0211 330/136 |
| 9,900,204 B2 * | 2/2018 | Levesque | H03F 1/0227 |

\* cited by examiner

*Primary Examiner* — Henry Choe
(74) *Attorney, Agent, or Firm* — Withrow & Terranova, P.L.L.C.

(57) ABSTRACT

A wide-bandwidth envelope tracking (ET) circuit is provided. In examples discussed herein, the wide-bandwidth ET circuit is configured to enable a differential amplifier circuit(s) to amplify a radio frequency (RF) signal(s) modulated at a wide-bandwidth (e.g., up to 160 MHz) without increasing power dissipation. Specifically, the wide-bandwidth ET circuit employs a pair of tracker circuits to concurrently provide ET modulated voltages and currents (e.g., direct current and/or alternating current) to the differential amplifier circuit(s) for amplifying the RF signal(s). For example, each of the tracker circuits can be configured to provide one-half (½) of the total current required by the differential amplifier circuit(s). Accordingly, the tracker circuits can be implemented with smaller output stages. As a result, the tracker circuits can supply the ET modulated voltages at a higher slew rate and reduced output impedance, thus helping to improve power dissipation in the wide-bandwidth ET circuit.

20 Claims, 5 Drawing Sheets

WIDE-BANDWIDTH ENVELOPE TRACKING CIRCUIT

RELATED APPLICATIONS

This application claims the benefit of provisional patent application Ser. No. 62/597,990, filed Dec. 13, 2017, the disclosure of which is hereby incorporated herein by reference in its entirety.

FIELD OF THE DISCLOSURE

The technology of the disclosure relates generally to radio frequency (RF) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth generation new radio (5G-NR) and Wi-Fi that typically operates in higher frequency spectrums. To achieve higher data rates with increased robustness in the higher frequency spectrums, the mobile communication devices may employ multiple antennas to enable multiple-input multiple-output (MIMO) and/or beamforming operations. Sophisticated power amplifiers (PAs) may be employed to increase output power of radio frequency (RF) signals (e.g., maintaining sufficient energy per bit) prior to transmitting the RF signals from the multiple antennas. However, the increased number of antennas and PAs can lead to increased power dissipation in the mobile communication devices, thus compromising overall performance and user experiences.

Envelope tracking is a power management technology designed to improve efficiency levels of the PAs to help reduce power dissipation in the mobile communication devices. As the name suggests, an envelope tracking system keeps track of an amplitude envelope of the RF signals communicated by the mobile communication devices. The envelope tracking system constantly adjusts supply voltages applied to the PAs to ensure that the PAs are operating at a higher linearity and efficiency for a given instantaneous output power requirement of the RF signals. In this regard, linearity and efficiency of the envelope tracking system can impact overall power consumption and RF performance of the mobile communication devices, particularly in the millimeter wave frequency spectrums.

SUMMARY

Embodiments of the disclosure relate to a wide-bandwidth envelope tracking (ET) circuit. In examples discussed herein, the wide-bandwidth ET circuit is configured to enable a differential amplifier circuit(s) to amplify a radio frequency (RF) signal(s) modulated at a wide-bandwidth (e.g., up to 160 MHz) without increasing power dissipation. Specifically, the wide-bandwidth ET circuit employs a pair of tracker circuits to concurrently provide ET modulated voltages and currents (e.g., direct current and/or alternating current) to the differential amplifier circuit(s) for amplifying the RF signal(s). For example, each of the tracker circuits can be configured to provide one-half (½) of the total current required by the differential amplifier circuit(s). Accordingly, the tracker circuits can be implemented with smaller output stages. As a result, the tracker circuits can supply the ET modulated voltages at a higher slew rate and reduced output impedance, thus helping to improve power dissipation in the wide-bandwidth ET circuit.

In one aspect, a wide-bandwidth ET circuit is provided. The wide-bandwidth ET circuit includes a differential amplifier circuit including a first amplifier input and a second amplifier input. The differential amplifier circuit is configured to receive a first input voltage and a first input current at the first amplifier input. The differential amplifier circuit is also configured to receive a second input voltage and a second input current at the second amplifier input. The differential amplifier circuit is also configured to amplify an RF signal based on the first input voltage, the first input current, the second input voltage, and the second input current. The wide-bandwidth ET circuit also includes a first tracker circuit comprising a first tracker output and configured to generate a first ET modulated voltage and a first current at the first tracker output. The wide-bandwidth ET circuit also includes a second tracker circuit comprising a second tracker output and configured to generate a second ET modulated voltage and a second current at the second tracker output. The wide-bandwidth ET circuit also includes control circuitry. The control circuitry is configured to couple the first tracker output to the first amplifier input to provide the first ET modulated voltage and the first current to the differential amplifier circuit as the first input voltage and the first input current, respectively. The control circuitry is also configured to couple the second tracker output to the second amplifier input to provide the second ET modulated voltage and the second current to the differential amplifier circuit as the second input voltage and the second input current, respectively.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a wide-bandwidth envelope tracking (ET) circuit. In examples discussed herein, the wide-bandwidth ET circuit is configured to enable a differential amplifier circuit(s) to amplify a radio frequency (RF) signal(s) modulated at a wide-bandwidth (e.g., up to 160 MHz) without increasing power dissipation. Specifically, the wide-bandwidth ET circuit employs a pair of tracker circuits to concurrently provide ET modulated voltages and currents (e.g., direct current and/or alternating current) to the differential amplifier circuit(s) for amplifying the RF signal(s). For example, each of the tracker circuits can be configured to provide one-half (½) of the total current required by the differential amplifier circuit(s). Accordingly, the tracker circuits can be implemented with smaller output stages. As a result, the tracker circuits can supply the ET modulated voltages at a higher slew rate and reduced output impedance, thus helping to improve power dissipation in the wide-bandwidth ET circuit.

Before discussing the wide-bandwidth ET circuit of the present disclosure, a brief overview of an existing ET circuit is first discussed with reference to FIGS. 1A-1C to help understand the issues related to enabling ET with wide-bandwidth modulation. The discussion of specific exemplary aspects of a wide-bandwidth ET circuit starts below with reference to FIG. 2.

Figure 1A:
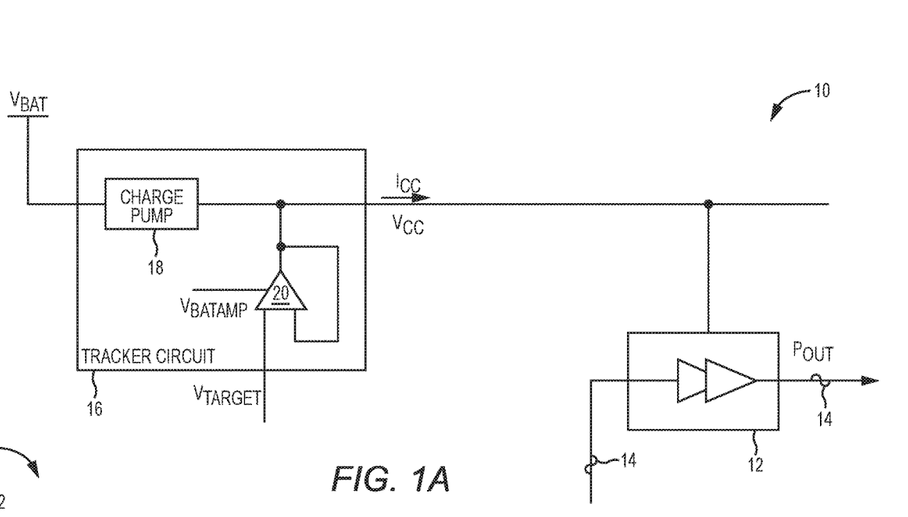
FIG. 1A is a schematic diagram of an exemplary existing envelope tracking (ET) circuit in which an amplifier circuit is configured to amplify a radio frequency (RF) signal based on an ET modulated voltage generated by a tracker circuit.

In this regard, FIG. 1A is a schematic diagram of an exemplary existing ET circuit 10 in which an amplifier circuit 12 is configured to amplify an RF signal 14 based on an ET modulated voltage $V_{CC}$ generated by a tracker circuit 16.

The tracker circuit 16 includes charge pump circuitry 18 and tracker circuitry 20. The charge pump circuitry 18 is coupled to a battery voltage $V_{BAT}$ and configured to generate a current $I_{CC}$, which may include both a direct current and an alternating current. The tracker circuitry 20 receives a supply voltage $V_{BATAMP}$, which can be derived from the battery voltage $V_{BAT}$. The tracker circuitry 20 receives a target voltage $V_{TARGET}$ and generates the ET modulated voltage $V_{CC}$ based on the target voltage $V_{TARGET}$.

The RF signal 14 may be modulated to follow a time-variant power envelope that can produce a higher peak power from time to time. Accordingly, the tracker circuit 16 is required to provide the ET modulated voltage $V_{CC}$ and the current $I_{CC}$ at a sufficient level such that the amplifier circuit 12 can amplify the RF signal 14 to the output power $P_{OUT}$ corresponding to the higher peak power of the time-variant power envelope. For example, the RF signal 14 has a peak power in excess of 28.5 dBm and the amplifier circuit 12 is required to amplify the RF signal 14 to a Class 2 output power in excess of 26 dBm. If the amplifier circuit 12 has 45% power amplifier efficiency (PAE) and the ET modulated voltage $V_{CC}$ is at 5 V, the current $I_{CC}$ generated by the tracker circuit 16 would need to be approximately 314.6 mA. As such, the tracker circuitry 20 needs to employ an output stage large enough to produce the required current $I_{CC}$.

Figure 1B:
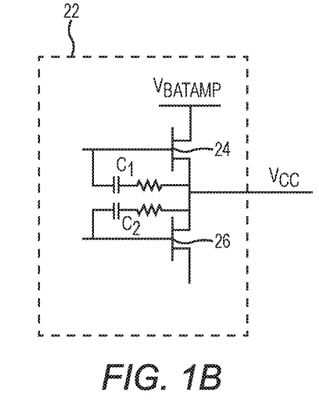
FIG. 1B is a schematic diagram providing an exemplary illustration of an output stage of tracker circuitry in the existing ET circuit of FIG. 1A.

FIG. 1B is a schematic diagram providing an exemplary illustration of an output stage 22 of the tracker circuitry 20 in the existing ET circuit 10 of FIG. 1A. The output stage 22 includes a first transistor 24 and a second transistor 26 disposed in series. The first transistor 24 may be a p-type field-effect transistor (pFET) and the second transistor 26 may be an n-type field-effect transistor (nFET). When the supply voltage $V_{BATAMP}$ is applied to the output stage 22, the first transistor 24 and the second transistor 26 can produce parasitic capacitance. As such, a pair of balance capacitors $C_1$ and $C_2$ may be provided in the output stage 22 to help balance the parasitic capacitances.

As stated above, the output stage 22 needs to produce a sufficiently large current $I_{CC}$ such that the amplifier circuit 12 of FIG. 1A can amplify the RF signal 14 to the output power $P_{OUT}$ corresponding to the higher peak power of the time-variant power envelope. In this regard, the first transistor 24 and the second transistor 26 need to be sufficiently large, which can in turn produce larger parasitic capacitance during operation. As a result, the balance capacitors $C_1$ and $C_2$ need to be bigger so as to provide a higher balance capacitance to balance the increased parasitic capacitance. The increased size of the first transistor 24, the second transistor 26, and the balance capacitors $C_1$ and $C_2$ can lead to a larger footprint and more power consumption of the output stage 22. In addition, the higher balance capacitance introduced by the balance capacitors $C_1$ and $C_2$ can reduce slew rate of the tracker circuitry 20, which reduces voltage modulation bandwidth of the tracker circuitry 20.

Figure 1C:
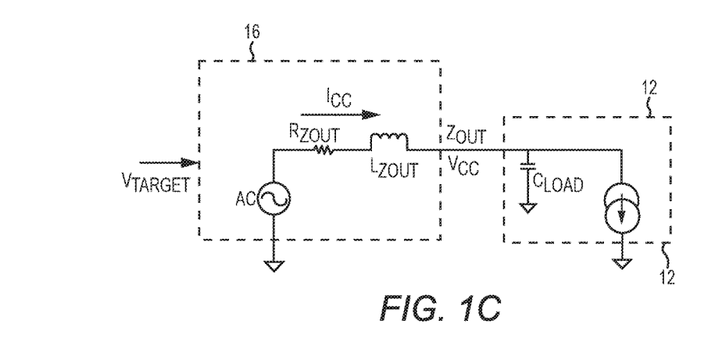
FIG. 1C is a schematic diagram showing that an output impedance of the tracker circuit of FIG. 1A can be modeled by an output inductance and an output resistance.

With reference back to FIG. 1A, the tracker circuit 16 includes inherent output impedance $Z_{OUT}$, which can be modeled as being primarily determined by an output inductance $L_{ZOUT}$ and an output resistance $R_{ZOUT}$, as shown in FIG. 1C. FIG. 1C is a schematic diagram showing that the output impedance $Z_{OUT}$ of the tracker circuit 16 of FIG. 1A can be modeled by the output inductance $L_{ZOUT}$ and the output resistance $R_{ZOUT}$. Common elements between FIGS. 1A-1C are shown therein with common element numbers and will not be re-described herein.

An impact of the output impedance $Z_{OUT}$ on the ET modulated output voltage $V_{CC}$ can be expressed in equation (Eq. 1) below.

$$V_{CC} = V_{TARGET} - L_{ZOUT} \cdot dI_{CC}/dt - R_{ZOUT} I_{CC} \quad \text{(Eq. 1)}$$

As shown in equation (Eq. 1) above, the output impedance $Z_{OUT}$ can cause a voltage deviation between the target voltage $V_{TARGET}$ and the ET modulated voltage $V_{CC}$, which can be worsened when the RF signal 14 is modulated at a wider modulation bandwidth. In addition, the output impedance $Z_{OUT}$ can increase power dissipation in the existing ET circuit 10. Furthermore, when capacitance of the balance capacitors $C_1$ and $C_2$ in the output stage 22 of the tracker circuit 16 increases, the output impedance $Z_{OUT}$ can increase as well, thus reducing slew rate of the tracker circuit 16 and causing further deviation in the ET modulated voltage $V_{CC}$. Hence, it may be desirable to reduce the output impedance $Z_{OUT}$ to help improve slew rate and power dissipation of the tracker circuit 16.

Figure 2:
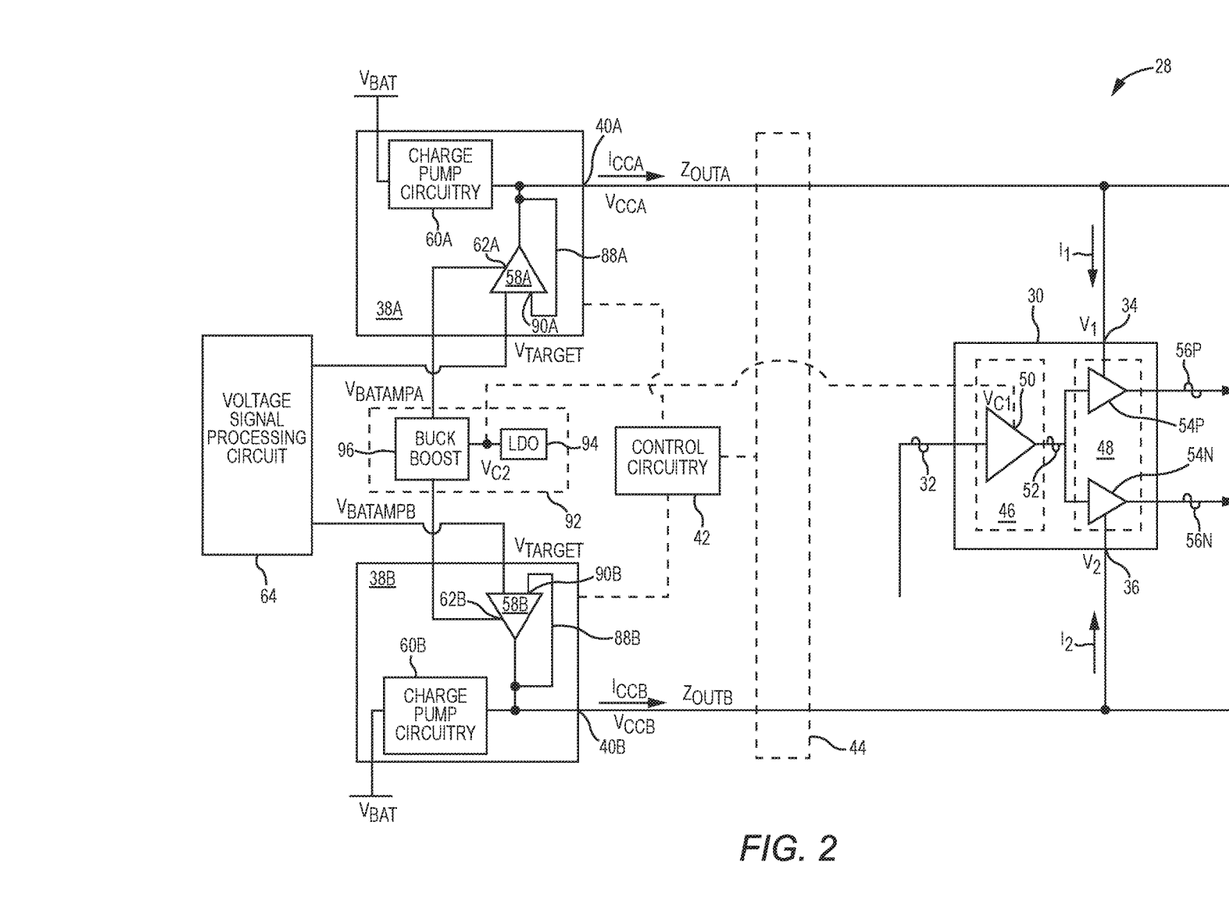
FIG. 2 is a schematic diagram of an exemplary ET circuit configured to support wide-bandwidth envelope tracking according to one embodiment of the present disclosure.

In this regard, FIG. 2 is a schematic diagram of an exemplary ET circuit 28 configured to support wide-bandwidth envelope tracking according to one embodiment of the present disclosure. The ET circuit 28 includes a differential amplifier circuit 30 configured to amplify an RF signal 32 modulated at a wide-bandwidth ranging from 20 MHz to 120 MHz. The differential amplifier circuit 30 includes a first amplifier input 34 and a second amplifier input 36. The differential amplifier circuit is configured to receive a first input voltage $V_1$ and a first input current $I_1$ at the first amplifier input 34. The differential amplifier circuit is also configured to receive a second input voltage $V_2$ and a second input current $I_2$ at the second amplifier input 36. Accordingly, the differential amplifier circuit 30 amplifies the RF signal 32 based on the first input voltage $V_1$, the first input current $I_1$, the second input voltage $V_2$, and the second input current $I_2$.

The ET circuit 28 includes a first tracker circuit 38A and a second tracker circuit 38B. The first tracker circuit 38A is configured to generate a first ET modulated voltage $V_{CCA}$ and a first current $I_{CCA}$ at a first tracker output 40A. The second tracker circuit 38B is configured to generate a second ET modulated voltage $V_{CCB}$ and a second current $I_{CCB}$ at a second tracker output 40B.

The ET circuit 28 includes control circuitry 42, which can be provided as a microprocessor, a microcontroller, a digital signal processor (DSP), or a field-programmable gate array (FPGA), for example. The control circuitry 42 is configured to concurrently couple the first tracker output 40A and the second tracker output 40B to the first amplifier input 34 and second amplifier input 36, respectively. In this regard, the first tracker circuit 38A provides the first ET modulated voltage $V_{CCA}$ and the first current $I_{CCA}$ to the first amplifier input 34 as the first input voltage $V_1$ and the first input current $I_1$, respectively. Likewise, the second tracker circuit 38B provides the second ET modulated voltage $V_{CCB}$ and the second current $I_{CCB}$ to the second amplifier input 36 as the second input voltage $V_2$ and the second input current $I_2$, respectively. Accordingly, the differential amplifier circuit 30 amplifies the RF signal 32 based on the first ET modulated voltage $V_{CCA}$, the first current $I_{CCA}$, the second ET modulated voltage $V_{CCB}$, and the second current $I_{CCB}$.

In a non-limiting example, the differential amplifier circuit 30 receives the first ET modulated voltage $V_{CCA}$ that substantially equals the second ET modulated voltage $V_{CCB}$ (e.g., $V_{CCA} = V_{CCB} \pm 0.1$ mV). Similarly, the differential amplifier circuit 30 also receives the first current $I_{CCA}$ that substantially equals the second current $I_{CCB}$ (e.g., $I_{CCA} = I_{CCB} \pm 0.1$ mA).

In this regard, in contrast to the tracker circuit 16 of FIG. 1A, each of the first tracker circuit 38A and the second tracker circuit 38B only needs to generate approximately one-half (½) of the total current (e.g., $I_1+I_2$) required by the differential amplifier circuit 30. As such, each of the first tracker circuit 38A and the second tracker circuit 38B can employ a respective output stage that is approximately ½ the size of the output stage 22 in FIG. 1B. Accordingly, the first tracker circuit 38A and the second tracker circuit 38B each present approximately ½ of the output impedance $Z_{OUT}$ compared to the tracker circuit 16 of FIG. 1C. As a result, each of the first tracker circuit 38A and the second tracker circuit 38B may double the slew rate of the tracker circuit 16 in the existing ET circuit 10 of FIG. 1A. Therefore, it may be possible for the ET circuit 28 to support wide-bandwidth envelope tracking concurrent to reducing output impedance and improving power dissipation.

In a non-limiting example, the ET circuit 28 includes switching circuitry 44. The control circuitry 42 can control the switching circuitry 44 to couple the first tracker output 40A and the second tracker output 40B to the first amplifier input 34 and the second amplifier input 36, respectively. It should be appreciated that it is also possible for the control circuitry 42 to couple the first tracker output 40A and the second tracker output 40B to the second amplifier input 36 and the first amplifier input 34, respectively. It should also be appreciated that the switching circuitry 44 may include any type and number of switches disposed according to any layout and/or configuration without affecting functionality of the switching circuitry 44.

The differential amplifier circuit 30 includes driver stage circuitry 46 and differential output stage circuitry 48. The driver stage circuitry 46 includes a driver stage amplifier input 50 configured to receive a driver stage input voltage $V_{C1}$ and amplify the RF signal 32 based on the driver stage input voltage $V_{C1}$ to generate a driver stage signal 52. The differential output stage circuitry 48 includes a positive output stage amplifier 54P and a negative output stage amplifier 54N. The positive output stage amplifier 54P is coupled to the first amplifier input 34 to receive the first input voltage $V_1$ and the first input current $I_1$. The positive output stage amplifier 54P is configured to amplify the driver stage signal 52 based on the first input voltage $V_1$ and the first input current $I_1$ to generate a positive output stage RF signal 56P. The negative output stage amplifier 54N is coupled to the second amplifier input 36 to receive the second input voltage $V_2$ and the second input current $I_2$. The negative output stage amplifier 54N is configured to amplify the driver stage signal 52 based on the second input voltage $V_2$ and the second input current $I_2$ to generate a negative output stage RF signal 56N.

The first tracker circuit 38A includes first tracker circuitry 58A and first charge pump circuitry 60A. The first charge pump circuitry 60A receives a battery voltage $V_{BAT}$ and generates the first current $I_{CCA}$, which can be a DC current, an AC current, or a combination of both, at the first tracker output 40A based on the battery voltage $V_{BAT}$. The first tracker circuitry 58A receives a first supply voltage $V_{BATAMPA}$ at a first supply voltage input 62A. The first tracker circuitry 58A is also configured to receive a target voltage $V_{TARGET}$ representing a time-variant target voltage envelope. Accordingly, the first tracker circuitry 58A generates the first ET modulated voltage $V_{CCA}$ having a first time-variant voltage envelope tracking the time-variant target voltage envelope of the target voltage $V_{TARGET}$ based on the first supply voltage $V_{BATAMPA}$. The first tracker circuitry 58A outputs the first ET modulated voltage $V_{CCA}$ via the first tracker output 40A.

The second tracker circuit 38B includes second tracker circuitry 58B and second charge pump circuitry 60B. The second charge pump circuitry 60B receives the battery voltage $V_{BAT}$ and generates the second current $I_{CCB}$, which can be a DC current, an AC current, or a combination of both, at the second tracker output 40B based on the battery voltage $V_{BAT}$. The second tracker circuitry 58B receives a second supply voltage $V_{BATAMPB}$ at a second supply voltage input 62B. The second tracker circuitry 58B is also configured to receive the target voltage $V_{TARGET}$ representing the time-variant target voltage envelope. Accordingly, the second tracker circuitry 58B generates the second ET modulated voltage $V_{CCB}$ having a second time-variant voltage envelope tracking the time-variant target voltage envelope of the target voltage $V_{TARGET}$ based on the second supply voltage $V_{BATAMPB}$. The second tracker circuitry 58B outputs the second ET modulated voltage $V_{CCB}$ via the second tracker output 40B.

Figure 3:
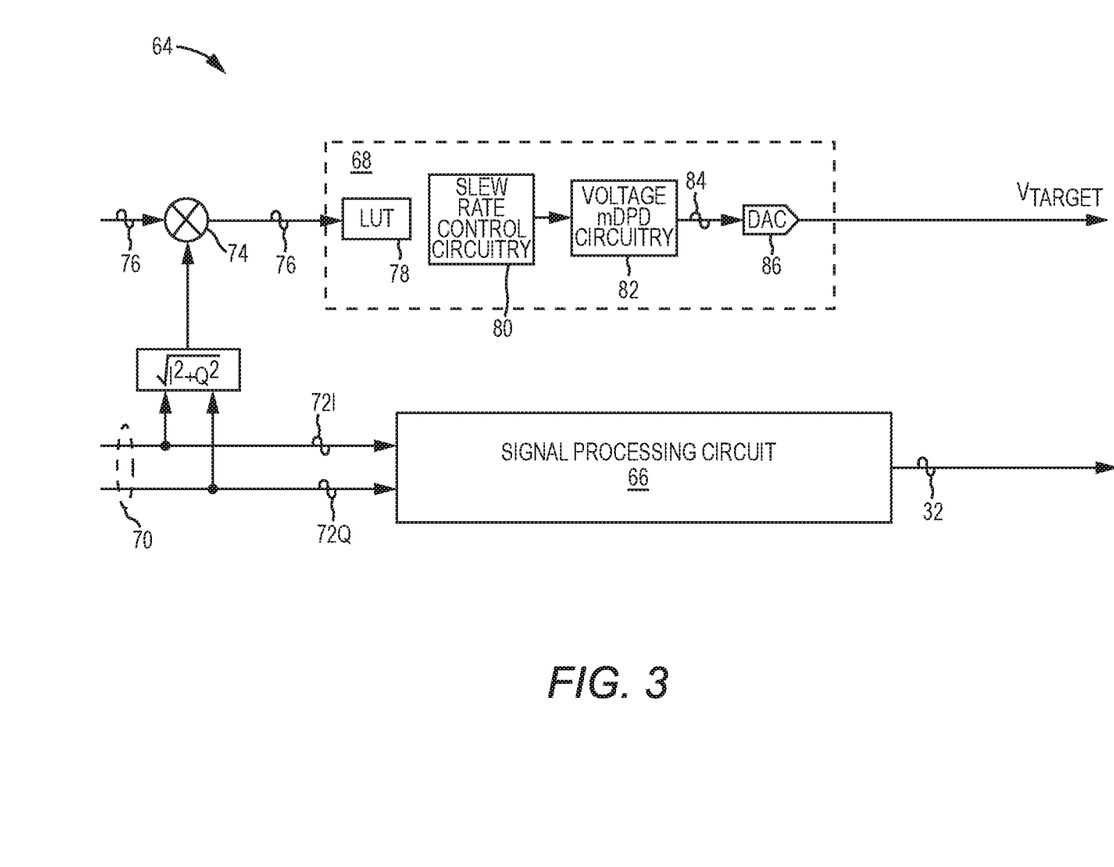
FIG. 3 is a schematic diagram providing an exemplary illustration of a voltage signal processing circuit provided in the ET circuit of FIG. 2.

The ET circuit 28 includes a voltage signal processing circuit 64 configured to generate the target voltage $V_{TARGET}$, as discussed next with reference to FIG. 3. In this regard, FIG. 3 is a schematic diagram providing an exemplary illustration of the voltage signal processing circuit 64 of FIG. 2. Common elements between FIGS. 2 and 3 are shown therein with common element numbers and will not be re-described herein.

The voltage signal processing circuit 64 includes a signal processing circuit 66 and a voltage processing circuit 68. The signal processing circuit 66 receives a digital signal 70 that includes a number of signal amplitudes representing a time-variant signal envelope. The signal processing circuit 66 is configured to convert the digital signal 70 into the RF signal 32 having a time-variant power envelope tracking the time-variant signal envelope of the digital signal 70. The signal processing circuit 66 provides the RF signal to the differential amplifier circuit 30 in FIG. 2.

The digital signal 70 may be modulated to include a digital in-phase signal 72I, which has a number of in-phase amplitudes I, and a digital quadrature signal 72Q, which has a number of quadrature amplitudes Q. In this regard, the signal amplitudes of the digital signal 70 can be expressed as $\sqrt{I^2+Q^2}$.

The voltage signal processing circuit 64 includes a mixer 74 that combines the signal amplitudes with a digital target voltage signal 76 such that the digital target voltage signal 76 can track the time-variant signal envelope of the digital signal 70. The voltage processing circuit 68 includes lookup table (LUT) circuitry 78, which stores predetermined target voltage amplitude values corresponding to the signal amplitudes. Accordingly, the LUT circuitry 78 converts the signal amplitudes into a number of predetermined target voltage amplitudes.

The voltage processing circuit 68 also includes slew rate control circuitry 80 coupled to the LUT circuitry 78. The slew rate control circuitry 80 is configured to nonlinearly modify the predetermined target voltage amplitudes to generate a number of target voltage amplitudes greater than or equal to the predetermined target voltage amplitudes, respectively.

The voltage processing circuit 68 includes voltage memory digital pre-distortion (mDPD) circuitry 82 coupled to the slew rate control circuitry 80. The voltage mDPD circuitry 82 is configured to digitally pre-distort the target voltage amplitudes to generate a digital target voltage signal 84 including the target voltage amplitudes. The voltage processing circuit 68 includes a digital-to-analog converter (DAC) 86 configured to convert the digital target voltage signal 84 into the target voltage $V_{TARGET}$ having the time-variant target voltage envelope tracking the target voltage amplitudes. The voltage processing circuit 68 is configured to provide the target voltage $V_{TARGET}$ to the first tracker circuitry 58A and the second tracker circuitry 58B in FIG. 2.

With reference back to FIG. 2, in one embodiment, the first tracker circuit 38A includes a first feedback path 88A coupled from the first tracker output 40A to a first feedback input 90A of the first tracker circuitry 58A. Similarly, the second tracker circuit 38B includes a second feedback path 88B coupled from the second tracker output 40B to a second feedback input 90B of the second tracker circuitry 58B. In an alternative embodiment, it is also possible to couple the first feedback path 88A from the second tracker output 40B to the first feedback input 90A and couple the second feedback path 88B from the first tracker output 40A to the second feedback input 90B.

The ET circuit 28 includes a supply voltage circuit 92, which includes low dropout regulator (LDO) circuitry 94 and buck-boost circuitry 96. The LDO circuitry 94 is configured to generate a constant voltage $V_{C2}$ and provide the constant voltage $V_{C2}$ to the buck-boost circuitry 96. The buck-boost circuitry 96, in turn, generates the first supply voltage $V_{BATAMPA}$ for the first tracker circuitry 58A and the second supply voltage $V_{BATAMPB}$ for the second tracker circuitry 58B based on the constant voltage $V_{C2}$. In a non-limiting example, the LDO circuitry 94 can be coupled to the driver stage amplifier input 50 to provide the constant voltage $V_{C2}$ to the driver stage circuitry 46 as the driver stage input voltage $V_{C1}$.

In a non-limiting example, the first input current $I_1$ can include a first input direct current and a first input alternating current. Similarly, the second input current $I_2$ can include a second input direct current and a second input alternating current. In this regard, the differential amplifier circuit 30 is configured to receive the first input direct current and the first input alternating current via the first amplifier input 34. Likewise, the differential amplifier circuit 30 also receives the second input direct current and the second input alternating current via the second amplifier input 36. Accordingly, the differential amplifier circuit 30 amplifies the RF signal 32 based on the first input voltage $V_1$, the first input direct current, the first input alternating current, the second input voltage $V_2$, the second input direct current, and the second input alternating current.

The first tracker circuit 38A is configured to generate the first current $I_{CCA}$ including the first direct current and the first alternating current. Likewise, the second tracker circuit 38B is configured to generate the second current $I_{CCB}$ including the second direct current and the second alternating current. In a non-limiting example, the first direct current can be substantially equal to the second direct current (e.g., the first direct current=the second direct current±0.1 mA). Similarly, the first alternating current can be substantially equal to the second alternating current (e.g., the first alternating current=the second alternating current±0.1 mA). The control circuitry 42 couples the first tracker output 40A to the first amplifier input 34 such that the first direct current and the first alternating current generated by the first tracker circuit 38A can be provided to the first tracker input 34 as the first input direct current and the first input alternating current, respectively. Likewise, control circuitry 42 couples the second tracker output 40B to the second amplifier input 36 such that the second direct current and the second alternating current generated by the second tracker circuit 38B can be provided to the second tracker input 36 as the second input direct current and the second input alternating current, respectively.

Figure 4:
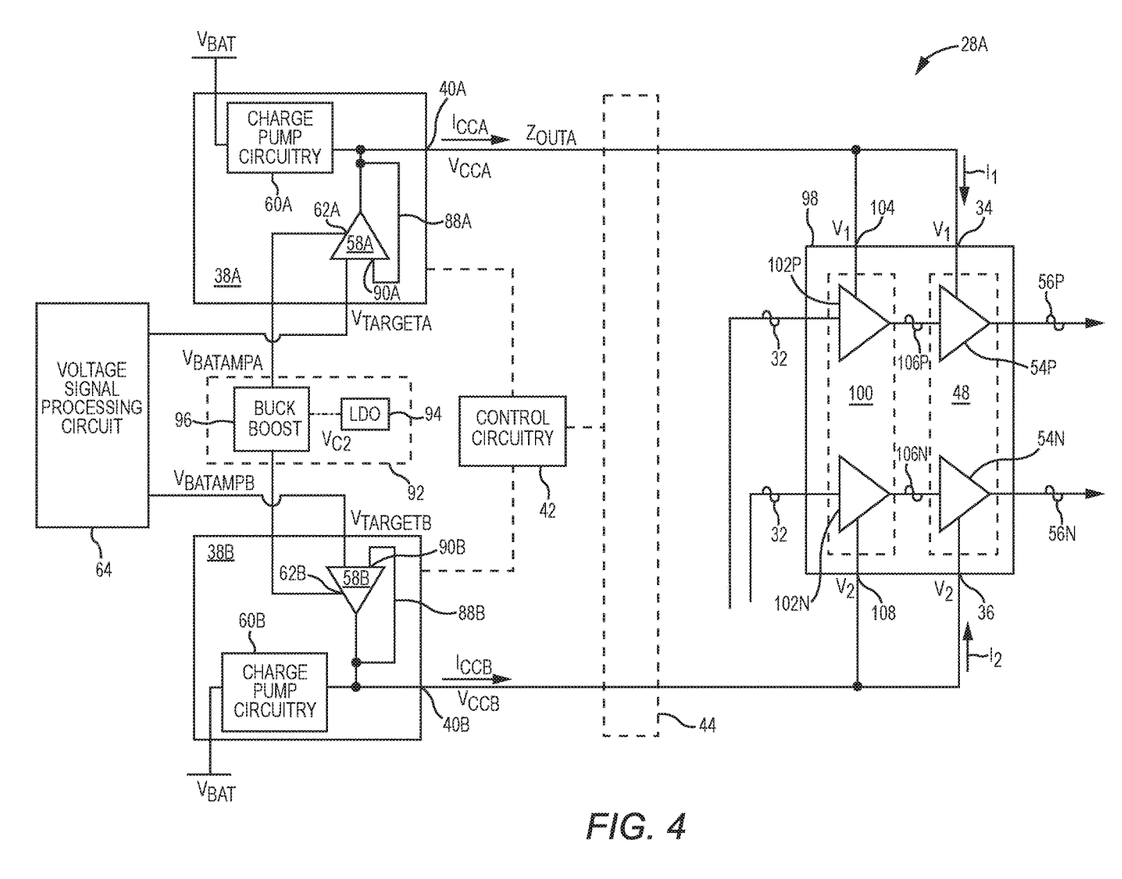
FIG. 4 is a schematic diagram of an exemplary ET circuit configured to support wide-bandwidth envelope tracking according to another embodiment of the present disclosure.

FIG. 4 is a schematic diagram of an exemplary ET circuit 28A configured to support wide-bandwidth envelope tracking according to one embodiment of the present disclosure. Common elements between FIGS. 2 and 4 are shown therein with common element numbers and will not be re-described herein.

The ET circuit 28A includes a differential amplifier circuit 98. The differential amplifier circuit 98 includes differential driver stage circuitry 100 and the differential output stage circuitry 48. The differential driver stage circuitry 100 includes a positive driver stage amplifier 102P and a negative driver stage amplifier 102N. The positive driver stage amplifier 102P is configured to receive the first input voltage $V_1$ at a first driver stage amplifier input 104 and amplify the RF signal 32 based on the first input voltage $V_1$ to generate a positive driver stage signal 106P. The control circuitry 42 is configured to couple the first tracker output 40A to the first driver stage amplifier input 104 such that the first tracker circuit 38A can provide the first ET modulated voltage $V_{CCA}$ to the positive driver stage amplifier 102P as the first input voltage $V_1$.

The negative driver stage amplifier 102N is configured to receive the second input voltage $V_2$ at a second driver stage amplifier input 108 and amplify the RF signal 32 based on the second input voltage $V_2$ to generate a negative driver stage signal 106N. The control circuitry 42 is configured to couple the second tracker output 40B to the second driver stage amplifier input 108 such that the second tracker circuit 38B can provide the second ET modulated voltage $V_{CCB}$ to the negative driver stage amplifier 102N as the second input voltage $V_2$.

The positive output stage amplifier 54P is configured to amplify the positive driver stage signal 106P to generate the positive output stage RF signal 56P. Likewise, the negative output stage amplifier 54N is configured to amplify the negative driver stage signal 106N to generate the negative output stage RF signal 56N.

Figure 5:
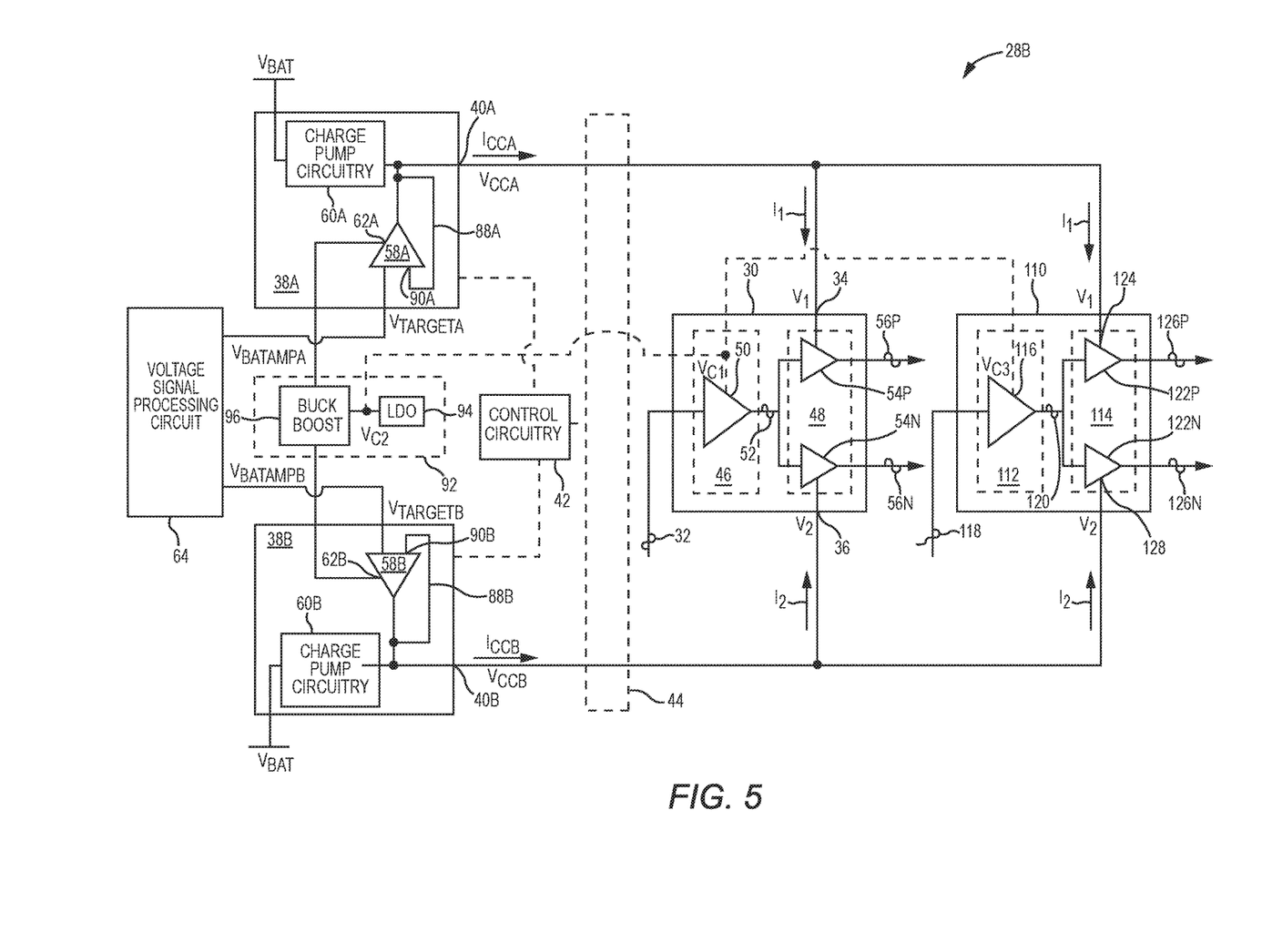
FIG. 5 is a schematic diagram of an exemplary ET circuit configured to support wide-bandwidth envelope tracking according to another embodiment of the present disclosure.

FIG. 5 is a schematic diagram of an exemplary ET circuit 28B configured to support wide-bandwidth envelope tracking according to one embodiment of the present disclosure. Common elements between FIGS. 2 and 5 are shown therein with common element numbers and will not be re-described herein.

The ET circuit 28B includes a second differential amplifier circuit 110 provided in parallel to the differential amplifier circuit 30. It should be appreciated that additional differential amplifier circuits can be provided in parallel to the differential amplifier circuit 30 and the second differential amplifier circuit 110.

The second differential amplifier circuit 110 includes second driver stage circuitry 112 and second differential output stage circuitry 114. The second driver stage circuitry 112 receives a second driver stage input voltage $V_{C3}$ at a second driver stage amplifier input 116. In a non-limiting example, the second driver stage amplifier input 116 can be coupled to the LDO circuitry 94. In this regard, the LDO circuitry 94 can provide the constant voltage $V_{C2}$ to the second driver stage circuitry 112 as the second driver stage input voltage $V_{C3}$. Accordingly, the second driver stage circuitry 112 amplifies a second RF signal 118, which may be the same as or different from the RF signal 32, based on the second driver stage input voltage $V_{C3}$ to generate a second driver stage signal 120.

The second differential output stage circuitry 114 includes a second positive output stage amplifier 122P and a second negative output stage amplifier 122N. The second positive output stage amplifier 122P includes a positive amplifier input 124 coupled to the first amplifier input 34. As such, the second positive output stage amplifier 122P can receive the first input voltage $V_1$ and the first input current $I_1$ at the positive amplifier input 124. Accordingly, the second positive output stage amplifier 122P amplifies the second driver stage signal 120 to generate a second positive output stage RF signal 126P.

The second negative output stage amplifier 122N includes a negative amplifier input 128 coupled to the second amplifier input 36. As such, the second negative output stage amplifier 122N can receive the second input voltage $V_2$ and the second input current $I_2$ at the negative amplifier input 128. Accordingly, the second negative output stage amplifier 122N amplifies the second driver stage signal 120 to generate a second negative output stage RF signal 126N.

Those skilled in the art will recognize improvements and modifications to the preferred embodiments of the present disclosure. All such improvements and modifications are considered within the scope of the concepts disclosed herein and the claims that follow.

What is claimed is:

1. A wide-bandwidth envelope tracking (ET) circuit comprising:
a differential amplifier circuit comprising a first amplifier input and a second amplifier input, the differential amplifier circuit configured to:
receive a first input voltage and a first input current at the first amplifier input;
receive a second input voltage and a second input current at the second amplifier input; and
amplify a radio frequency (RF) signal based on the first input voltage, the first input current, the second input voltage, and the second input current;
a first tracker circuit comprising a first tracker output and configured to generate a first ET modulated voltage and a first current at the first tracker output;
a second tracker circuit comprising a second tracker output and configured to generate a second ET modulated voltage and a second current at the second tracker output; and
control circuitry configured to:
couple the first tracker output to the first amplifier input to provide the first ET modulated voltage and the first current to the differential amplifier circuit as the first input voltage and the first input current, respectively; and
couple the second tracker output to the second amplifier input to provide the second ET modulated voltage and the second current to the differential amplifier circuit as the second input voltage and the second input current, respectively.

2. The wide-bandwidth ET circuit of claim 1 wherein the differential amplifier circuit is further configured to:
receive the first input voltage substantially equals the second input voltage; and
receive the first input current substantially equals the second input current.

3. The wide-bandwidth ET circuit of claim 1 wherein the RF signal is modulated at a modulation bandwidth up to 160 megahertz (MHz).

4. The wide-bandwidth ET circuit of claim 1 further comprising switching circuitry, wherein the control circuitry is further configured to control the switching circuitry to couple the first tracker output and the second tracker output to the first amplifier input and the second amplifier input, respectively.

5. The wide-bandwidth ET circuit of claim 1 wherein the differential amplifier circuit comprises:
driver stage circuitry comprising a driver stage amplifier input, the driver stage circuitry is configured to amplify the RF signal based on a driver stage input voltage received at the driver stage amplifier input to generate a driver stage signal; and
differential output stage circuitry comprising:
a positive output stage amplifier comprising the first amplifier input and configured to:
receive the first input voltage and the first input current via the first amplifier input; and
amplify the driver stage signal based on the first input voltage and the first input current to generate a positive output stage RF signal; and
a negative output stage amplifier comprising the second amplifier input and configured to:
receive the second input voltage and the second input current via the second amplifier input; and
amplify the driver stage signal based on the second input voltage and the second input current to generate a negative output stage RF signal.

6. The wide-bandwidth ET circuit of claim 5 wherein:
the first tracker circuit comprises:
first tracker circuitry configured to receive a first supply voltage and generate the first ET modulated voltage tracking a time-variant target voltage envelope associated with a target voltage based on the first supply voltage; and
first charge pump circuitry configured to generate the first current; and
the second tracker circuit comprises:
second tracker circuitry configured to receive a second supply voltage and generate the second ET modulated voltage tracking the time-variant target voltage envelope associated with the target voltage based on the second supply voltage; and
second charge pump circuitry configured to generate the second current.

7. The wide-bandwidth ET circuit of claim 6 further comprising:
a signal processing circuit configured to:
receive a digital signal having a plurality of signal amplitudes representing a time-variant signal envelope; and
convert the digital signal into the RF signal having a time-variant power envelope tracking the time-variant signal envelope; and
a voltage processing circuit configured to:
receive the plurality of signal amplitudes from the signal processing circuit;
generate a plurality of target voltage amplitudes based on the plurality of signal amplitudes;
generate the target voltage having the time-variant target voltage envelope tracking the plurality of target voltage amplitudes; and
provide the target voltage to the first tracker circuitry and the second tracker circuitry.

8. The wide-bandwidth ET circuit of claim 7 wherein the voltage processing circuit comprises voltage lookup table (LUT) circuitry configured to convert the plurality of signal amplitudes into a plurality of predetermined target voltage amplitudes.

9. The wide-bandwidth ET circuit of claim 8 wherein the voltage processing circuit further comprises slew rate control circuitry coupled to the voltage LUT circuitry and configured to nonlinearly modify the plurality of predetermined target voltage amplitudes to generate the plurality of target voltage amplitudes greater than or equal to the plurality of predetermined target voltage amplitudes, respectively.

10. The wide-bandwidth ET circuit of claim 9 wherein the voltage processing circuit further comprises:
memory digital pre-distortion (mDPD) circuitry configured to digitally pre-distort the plurality of target voltage amplitudes to generate a digital target voltage signal comprising the plurality of target voltage amplitudes; and
a digital-to-analog converter (DAC) configured to convert the digital target voltage signal into the target voltage having the time-variant target voltage envelope tracking the plurality of target voltage amplitudes.

11. The wide-bandwidth ET circuit of claim 10 wherein:
the first tracker circuitry is further configured to generate the first ET modulated voltage having a first time-variant voltage envelope tracking the time-variant target voltage envelope; and
the second tracker circuitry is further configured to generate the second ET modulated voltage having a second time-variant voltage envelope tracking the time-variant target voltage envelope.

12. The wide-bandwidth ET circuit of claim 6 wherein:
the first tracker circuit further comprises a first feedback path coupled from the first tracker output to a first feedback input of the first tracker circuitry; and
the second tracker circuit further comprises a second feedback path coupled from the second tracker output to a second feedback input of the second tracker circuitry.

13. The wide-bandwidth ET circuit of claim 6 wherein:
the first tracker circuit further comprises a first feedback path coupled from the second tracker output to a first feedback input of the first tracker circuitry; and
the second tracker circuit further comprises a second feedback path coupled from the first tracker output to a second feedback input of the second tracker circuitry.

14. The wide-bandwidth ET circuit of claim 6 further comprising a supply voltage circuit, the supply voltage circuit comprising:
at least one low dropout regulator (LDO) circuitry configured to generate at least one constant voltage; and
at least one buck-boost circuitry coupled to the first tracker circuitry and the second tracker circuitry, the at least one buck-boost circuitry configured to generate the first supply voltage and the second supply voltage based on the at least one constant voltage.

15. The wide-bandwidth ET circuit of claim 14 wherein the at least one LDO circuitry is coupled to the driver stage amplifier input to provide the at least one constant voltage to the driver stage circuitry as the driver stage input voltage.

16. The wide-bandwidth ET circuit of claim 14 further comprising at least one second differential amplifier circuit, the at least one second differential amplifier circuit comprising:
second driver stage circuitry comprising a second driver stage amplifier input, wherein the second driver stage circuitry is configured to amplify a second RF signal based on a second driver stage input voltage received at the second driver stage amplifier input to generate a second driver stage signal; and
second differential output stage circuitry comprising:
a second positive output stage amplifier comprising a positive amplifier input coupled to the first amplifier input, wherein the second positive output stage amplifier is configured to:
receive the first input voltage and the first input current via the positive amplifier input; and
amplify the second driver stage signal based on the first input voltage and the first input current to generate a second positive output stage RF signal; and
a second negative output stage amplifier comprising a negative amplifier input coupled to the second amplifier input, wherein the second negative output stage amplifier is configured to:
receive the second input voltage and the second input current via the negative amplifier input; and
amplify the second driver stage signal based on the second input voltage and the second input current to generate a second negative output stage RF signal.

17. The wide-bandwidth ET circuit of claim 16 wherein the at least one LDO circuitry is coupled to the second driver stage amplifier input to provide the at least one constant voltage to the second driver stage circuitry as the second driver stage input voltage.

18. The wide-bandwidth ET circuit of claim 1 wherein the differential amplifier circuit comprises:
differential driver stage circuitry comprising:
a positive driver stage amplifier comprising a first driver stage amplifier input and configured to:
receive the first input voltage via the first driver stage amplifier input; and
amplify the RF signal based on the first input voltage to generate a positive driver stage signal; and
a negative driver stage amplifier comprising a second driver stage amplifier input and configured to:
receive the second input voltage via the second driver stage amplifier input; and
amplify the RF signal based on the second input voltage to generate a negative driver stage signal; and
differential output stage circuitry comprising:
a positive output stage amplifier comprising the first amplifier input and configured to:
receive the first input voltage and the first input current via the first amplifier input; and
amplify the positive driver stage signal based on the first input voltage and the first input current to generate a positive output stage RF signal; and
a negative output stage amplifier comprising the second amplifier input and configured to:
receive the second input voltage and the second input current via the second amplifier input; and
amplify the negative driver stage signal based on the second input voltage and the second input current to generate a negative output stage RF signal.

19. The wide-bandwidth ET circuit of claim 1 wherein:
the differential amplifier circuit is further configured to:
receive the first current comprising a first input direct current and a first input alternating current at the first amplifier input;
receive the second current comprising a second input direct current and a second input alternating current at the second amplifier input; and
amplify the RF signal based on the first input voltage, the first input direct current, the first input alternating current, the second input voltage, the second input direct current, and the second input alternating current;
the first tracker circuit is further configured to generate a first direct current and a first alternating current at the first tracker output;
the second tracker circuit is further configured to generate a second direct current and a second alternating current at the second tracker output; and
the control circuitry is further configured to:
couple the first tracker output to the first amplifier input to provide the first ET modulated voltage, the first direct current, and the first alternating current to the differential amplifier circuit as the first input voltage, the first input direct current, and the first input alternating current, respectively; and couple the second tracker output to the second amplifier input to provide the second ET modulated voltage, the second direct current, and the second alternating current to the differential amplifier circuit as the second input voltage, the second input direct current, and the second input alternating current, respectively.

20. The wide-bandwidth ET circuit of claim 19 wherein the differential amplifier circuit is further configured to:
receive the first input voltage that substantially equals the second input voltage;
receive the first input direct current that substantially equals the second input direct current; and
receive the first input alternating current that substantially equals the second input alternating current.

* * * * *